United States Patent
Kim et al.

(10) Patent No.: US 11,431,083 B2
(45) Date of Patent: Aug. 30, 2022

(54) ELECTRONIC DEVICE INCLUDING EXPANDED FLEXIBLE PRINTED CIRCUIT BOARD ANTENNA MODULE

(71) Applicant: Samsung Electronics Co., Ltd., Suwon-si (KR)

(72) Inventors: Younju Kim, Suwon-si (KR); Kyeongjo Keum, Suwon-si (KR); Hojong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 16/833,170

(22) Filed: Mar. 27, 2020

(65) Prior Publication Data
US 2020/0313284 A1 Oct. 1, 2020

(30) Foreign Application Priority Data
Mar. 27, 2019 (KR) .................. 10-2019-0035389

(51) Int. Cl.
*H01Q 1/24* (2006.01)
*H05K 3/36* (2006.01)
(Continued)

(52) U.S. Cl.
CPC ............ *H01Q 1/243* (2013.01); *H01Q 1/38* (2013.01); *H01Q 1/526* (2013.01); *H04B 1/3888* (2013.01); *H04M 1/0277* (2013.01); *H05K 1/028* (2013.01); *H05K 1/118* (2013.01); *H05K 1/147* (2013.01); *H05K 3/361* (2013.01);
(Continued)

(58) Field of Classification Search
CPC .......... H01Q 1/243; H01Q 1/38; H01Q 1/526; H04B 1/3888; H04M 1/0277; H05K 1/028; H05K 1/147; H05K 3/361; H05K 2201/042; H05K 2201/05;
(Continued)

(56) References Cited

U.S. PATENT DOCUMENTS 8,169,782 B2 5/2012 Takahashi et al.
9,465,467 B2 10/2016 Lee
(Continued)

FOREIGN PATENT DOCUMENTS

CN 204596965 U 8/2015
EP 3196977 A1 7/2017
KR 101570617 B1 11/2015

OTHER PUBLICATIONS

International Search Report dated Jul. 17, 2020 in connection with International Patent Application No. PCT/KR2020/004273, 3 pages.
(Continued)

*Primary Examiner* — Binh B Tran

(57) ABSTRACT

An electronic device includes a housing configured to form an internal space, a radiating sheet configured to be disposed in the internal space; at least one electronic component configured to be disposed in the internal space and to be in contact with the radiating sheet. An FPCB antenna module configured to be disposed on the radiating sheet includes a conductive pattern and a nonconductive layer configured to surround the conductive pattern, wherein the nonconductive layer may extend on the radiating sheet to a region in which the electronic component is positioned.

20 Claims, 12 Drawing Sheets

(51) Int. Cl.
    *H05K 1/11*     (2006.01)
    *H01Q 1/38*     (2006.01)
    *H05K 1/02*     (2006.01)
    *H01Q 1/52*     (2006.01)
    *H04M 1/02*     (2006.01)
    *H04B 1/3888*     (2015.01)
    *H05K 1/14*     (2006.01)
    *B82Y 10/00*     (2011.01)

(52) U.S. Cl.
    CPC ........ *B82Y 10/00* (2013.01); *H05K 2201/042* (2013.01); *H05K 2201/05* (2013.01); *H05K 2201/09218* (2013.01); *H05K 2201/10098* (2013.01)

(58) Field of Classification Search
    CPC . H05K 2201/0918; H05K 2201/10098; B82Y 10/00
    USPC .......................................................... 343/895
    See application file for complete search history.

(56) References Cited

U.S. PATENT DOCUMENTS

| | | |
|---|---|---|
| 10,134,540 B2 | 11/2018 | Choi et al. |
| 2016/0218422 A1 | 7/2016 | Choi et al. |
| 2016/0372837 A1 | 12/2016 | Jung et al. |
| 2017/0300736 A1* | 10/2017 | Song .................. G06V 40/1312 |
| 2018/0026326 A1 | 1/2018 | Noh et al. |
| 2018/0035528 A1 | 2/2018 | Kim et al. |
| 2018/0205131 A1 | 7/2018 | Hwang et al. |
| 2018/0301790 A1 | 10/2018 | Kim et al. |
| 2019/0051967 A1 | 2/2019 | Ryu et al. |
| 2020/0021016 A1* | 1/2020 | Son ...................... H01Q 21/065 |

OTHER PUBLICATIONS

Written Opinion of the International Searching Authority dated Jul. 17, 2020 in connection with International Patent Application No. PCT/KR2020/004273, 4 pages.

European Patent Office, "Supplementary European Search Report" dated Jan. 31, 2022, in connection with European Patent Application No. EP20778501.5, 8 pages.

\* cited by examiner

ELECTRONIC DEVICE INCLUDING EXPANDED FLEXIBLE PRINTED CIRCUIT BOARD ANTENNA MODULE

CROSS-REFERENCE TO RELATED APPLICATION

This application is based on and claims priority under 35 U.S.C. 119 to Korean Patent Application No. 10-2019-0035389 filed on Mar. 27, 2019 in the Korean Intellectual Property Office, the disclosure of which is herein incorporated by reference in its entirety.

BACKGROUND

1. Field

Certain embodiments according to the present disclosure relate to an electronic device including an extended flexible printed circuit board (FPCB) antenna module.

2. Description of Related Art

A flexible printed circuit board (FPCB) is a thin and lightweight board that can fit into small spaces and be formed into specific shapes. An FPCB includes a conductive strip, such as a copper strip, and a nonconductive material, such as polyimide, surrounding the conductive strip. An FPCB is an electronic component for overcoming the weaknesses of an existing printed circuit board (PCB) in order to satisfy the trend toward compact and complex electronic products.

As the performance of electronic products improves and the size thereof is decreased, electronic components mounted therein require high performance and are highly integrated, thus generating great heat in the electronic products. The generated heat reduces the lifespan of the products, causes malfunctions, or entails the risk of an explosion or fire. Therefore, a system for dissipating the heat generated inside the products to the outside or a self-cooling system is needed. A radiating sheet is generally used for electronic products requiring light weight and slimness.

The above information is presented as background information only to assist with an understanding of the disclosure. No determination has been made, and no assertion is made, as to whether any of the above might be applicable as prior art with regard to the disclosure.

SUMMARY

In certain embodiments according to this disclosure, electronic components are disposed in a housing of an electronic device. When the electronic device operates, heat may be generated in the electronic components (e.g., a wireless charging antenna, a processor, a speaker, and the like). To quickly discharge the heat, a radiating sheet may be attached to the electronic components. When a plurality of electronic components generating heat is attached to one radiating sheet, the radiating sheet may be damaged by a relative movement between the plurality of electronic components. When the radiating sheet is damaged, heat may accumulate in the electronic components, thus degrading the electronic components.

An electronic device according to certain embodiments may include: a housing configured to form an internal space; a radiating sheet configured to be disposed in the internal space; at least one electronic component configured to be disposed in the internal space and to be in contact with the radiating sheet; and an FPCB antenna module configured to be disposed on the radiating sheet and to include a conductive pattern and a nonconductive layer configured to surround the conductive pattern, wherein the nonconductive layer may extend on the radiating sheet to a region in which the electronic component is positioned.

An electronic device according to certain embodiments may include: a housing configured to form an internal space; a printed circuit board (PCB) configured to be disposed in the internal space; an electronic component configured to be disposed in the internal space and to be electrically connected to the PCB; a radiating sheet configured to be partly or entirely in contact with the electronic component and the PCB; and an FPCB antenna module configured to include a conductive pattern to electromagnetically operate in connection with an external device of the electronic device and to be electrically connected to the PCB and a nonconductive layer configured to surround the conductive pattern, and to be disposed on the radiating sheet, wherein the nonconductive layer may extend on the radiating sheet to the PCB or the electronic component.

An electronic device according to various embodiments may include a nonconductive layer extending on a radiating sheet to a region in which an electronic component is positioned, thereby enhancing the strength of the radiating sheet.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
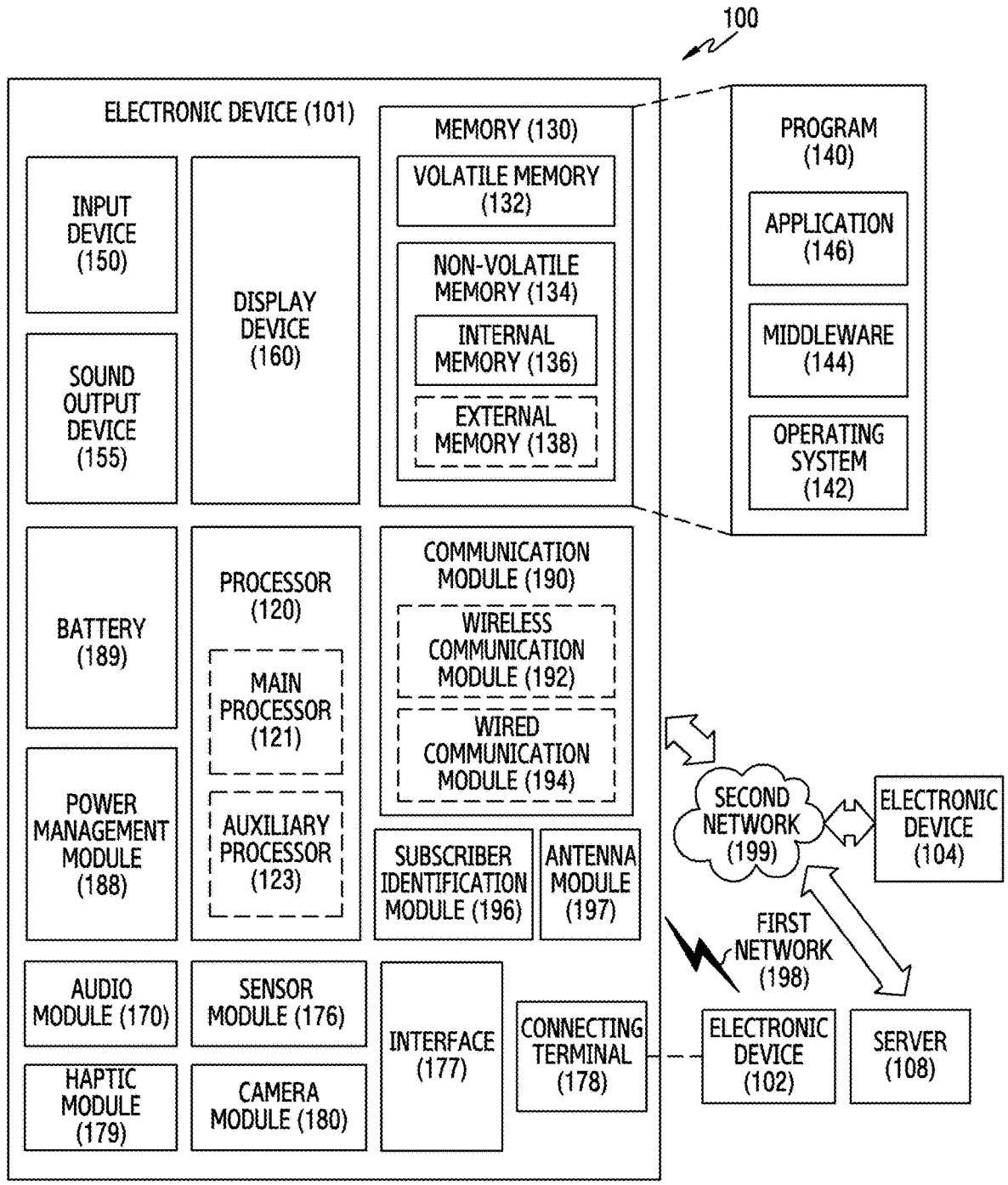
FIG. 1 illustrates, in block diagram format, an electronic device in a network environment according to various embodiments of this disclosure.

FIG. 1 illustrates, in block diagram format, an example of an electronic device 101 in a network environment 100 according to various embodiments. Referring to the non-limiting example of FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to certain embodiments, the electronic device 101 may communicate with the electronic device 104 via the server 108. According to certain embodiments, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module(SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to certain embodiments, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to certain embodiments, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to certain embodiments, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to certain embodiments, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to certain embodiments, the audio module 170 may obtain the sound via the input device 150, or output the sound via the sound output device 155 or a headphone of an external electronic device (e.g., an electronic device 102) directly (e.g., through a physical coupling, such as a wire) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to certain embodiments, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., through a physical coupling, such as a wire) or wirelessly. According to certain embodiments, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to certain embodiments, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to certain embodiments, the haptic module 179 may include, for example, a motor, a piezoelectric element, or an electric stimulator.

The camera module 180 may capture a still image or moving images. According to certain embodiments, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to certain embodiments, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to certain embodiments, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH™, wireless-fidelity (WI-FI) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to certain embodiments, the antenna module 197 may include an antenna including a radiating element composed of a conductive material or a conductive pattern formed in or on a substrate (e.g., PCB). According to certain embodiments, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to certain embodiments, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to certain embodiments, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to certain embodiments, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to certain embodiments of the disclosure, the electronic devices are not limited to those described above.

It should be appreciated that various embodiments as described by the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., through a physical connection, such as a wire or bus), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to certain embodiments, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to certain embodiments, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
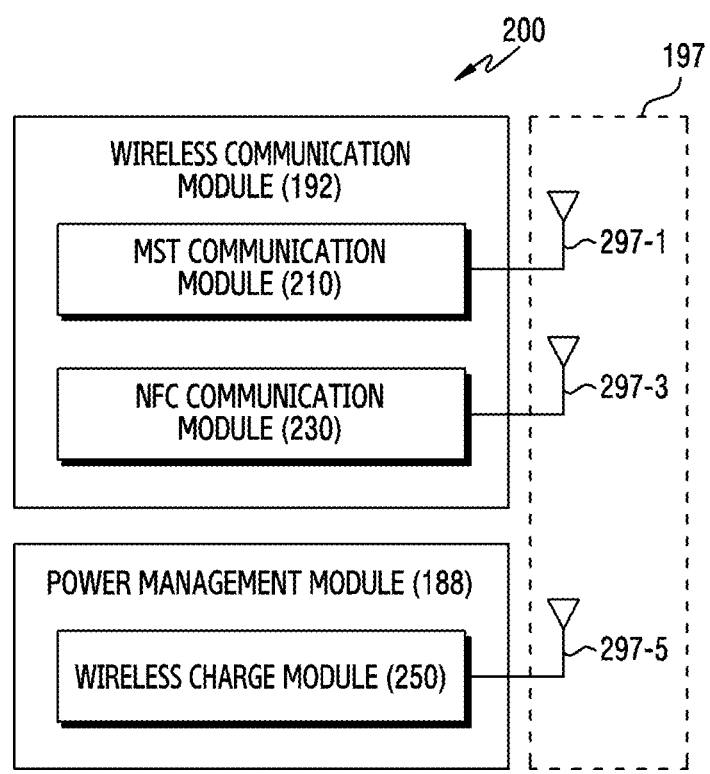
FIG. 2 illustrates, in block diagram format, a wireless communication module, a power management module, and an antenna module of an electronic device according to some embodiments of this disclosure.

FIG. 2 illustrates, in a block diagram 200, an example of the wireless communication module 192, the power management module 188, and the antenna module 197 of the electronic device 101 according to various embodiments. Referring to the non-limiting example of FIG. 2, the wireless communication module 192 may include a magnetic secure transmission (MST) communication module 210 or a near-field communication (NFC) module 230, and the power management module 188 may include a wireless charging module 250. In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to certain embodiments, the MST communication module 210 may include a switching module (not shown) that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to certain embodiments, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to certain embodiments, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to certain embodiments, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit (not shown) adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to certain embodiments, at least one function of the MST communication module 210, the NFC communication module 230, or the wireless charging module 250 may be controlled by an external processor (e.g., the processor 120). According to certain embodiments, at least one specified function (e.g., a payment function) of the MST communication module 210 or the NFC communication module 230 may be performed in a trusted execution environment (TEE). According to certain embodiments, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

Figure 3A:
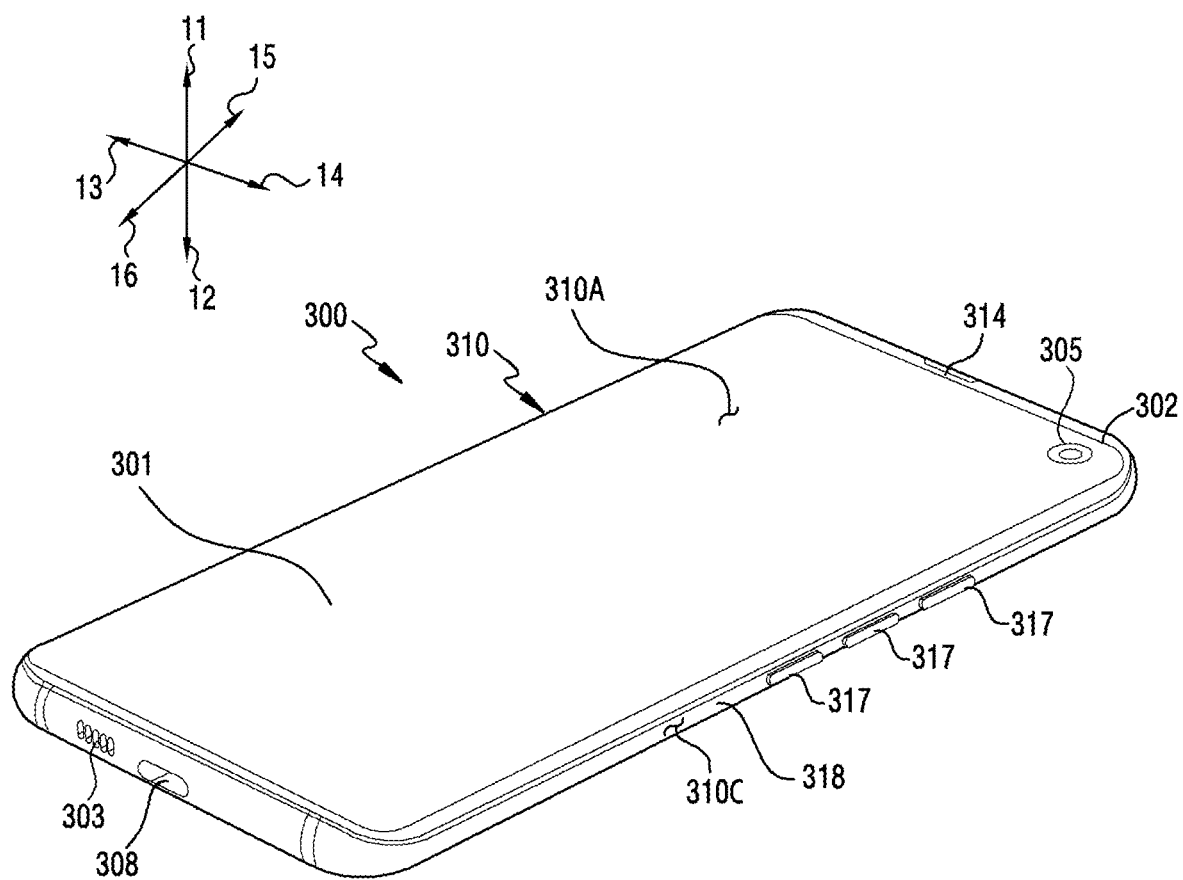
FIG. 3A illustrates, in perspective view, an example of an electronic device according to certain embodiments.

FIG. 3A illustrates, in perspective view, a front side of an example of mobile electronic device 300 according to various embodiments of the present disclosure.

Figure 3B:
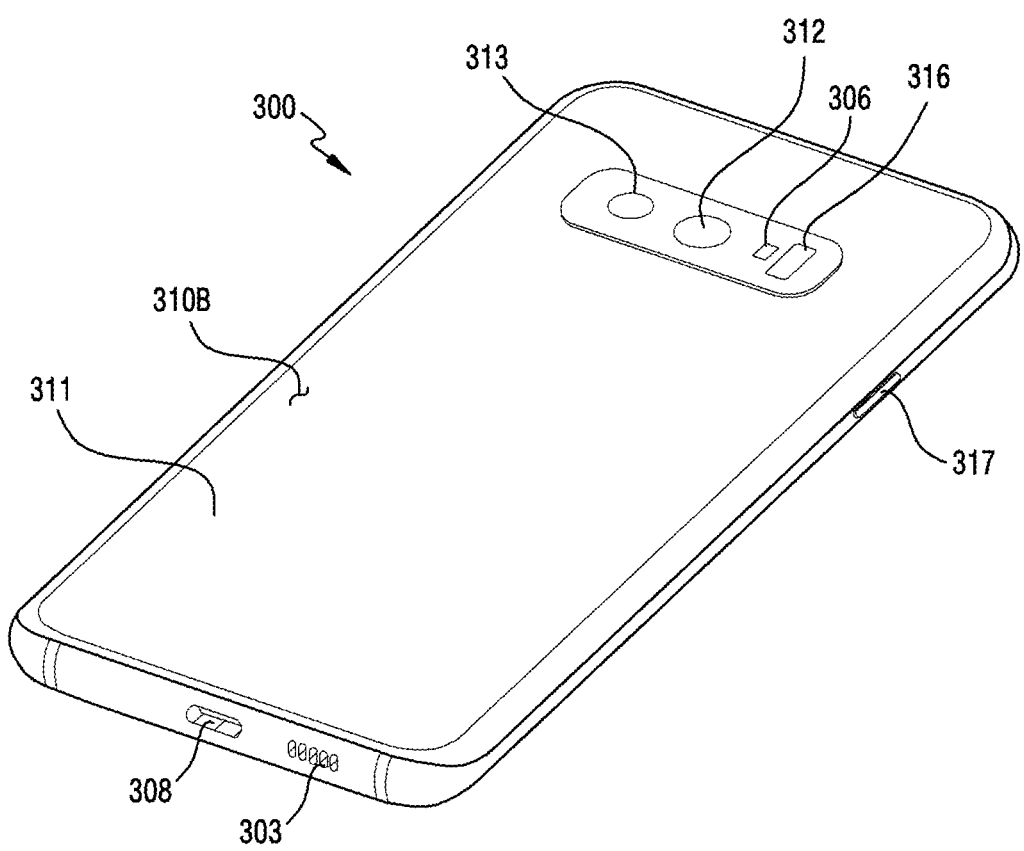
FIG. 3B illustrates, in perspective view, the example electronic device of FIG. 3A, as viewed from the back.

FIG. 3B illustrates, in perspective view, a back side of the example electronic device 300 of FIG. 3A according to various embodiments of the present disclosure.

Referring to the non-limiting examples of FIG. 3A and FIG. 3B, an electronic device 300 according to certain embodiments may include a housing 310 including a first side (or a front side) 310A, a second side (or a rear side) 310B, and a lateral side (surface) 310C surrounding a space between the first side 300A and the second side 310B. In certain embodiments, (not shown), the housing may refer to a structure which includes part of the first side 310A, second side 310B, and third side 310C of FIG. 1. According to certain embodiments, the first side 110A may be constructed of a front plate 302 (or a front cover) (e.g., a polymer plate or a glass plate having various coating layers) which is at least partially transparent.

The second side 110B may be constructed of a rear plate 111 (or a rear cover) which may be opaque. For example, the rear plate 111 may be constructed, for example, and without limitation, of coated or colored glass, ceramic, polymer, metallic materials (e.g. aluminum, stainless steel (STS), or magnesium), a combination of at least two of these materials, or the like.

The lateral side 110C (or a side member or side surface) may be constructed of a lateral bezel structure 118 (or a lateral member) bonded to the front plate 302 and the rear plate 111 and including, for example, and without limitation, metal and/or polymer. In some embodiments, the rear plate 111 and the lateral bezel structure 118 may be constructed integrally and may include the same material (e.g., a metallic material such as aluminum).

According to certain embodiments, the electronic device 300 may include at least one of a display 301, an audio module 303, 314, a sensor module, a camera module 305, a key input device 317, and a connector hole 308.

In some embodiments, the electronic device 300 may omit at least one of the components (for example, the key input device 317) or additionally include other components. For example, the electronic device 300 may include a sensor module (not shown). For example, within an area provided by the front plate 302, a sensor such as a proximity sensor or an illuminance sensor may be integrated into the display 301, or may be disposed at a position adjacent to the display 301. In some embodiments, the electronic device 300 may further include a light-emitting device, and the light-emitting device may be disposed at a position adjacent to the display 301 within an area provided by the front plate 302. The light-emitting device may provide, for example, state information of the electronic device 300 in the form of light. In another embodiment, the light-emitting device may provide, for example, a light source interlocked with the operation of the camera module 305. The light-emitting element may include, for example, an LED, an IR LED, and a xenon lamp.

The display 301 may be exposed, for example, through a significant portion of the front plate 302. In some embodiments, the edge of the display 301 may be formed to be substantially the same as an adjacent outer shape (e.g., a curved surface) of the front plate 302. In another embodiment (not shown), in order to expand the area where the display 301 is exposed, the distance between the outer edge of the display 301 and the outer edge of the front plate 302 may be substantially the same. In another embodiment (not shown), a recess or opening may be formed in a part of the screen display area of the display 301, and the electronic device (300) may include another electronic components (e.g., a camera module 305, a proximity sensor or an illuminance sensor) aligned with the recess or the opening.

In another embodiment, at least one of the camera modules 312, 313, the fingerprint sensor 316, and the flash 306 may be included on the rear surface of the screen display area of the display 301. In another embodiment, the display 301 is coupled to or adjacent to a touch sensing circuit, a pressure sensor capable of measuring the intensity (pressure) of the touch, and/or a digitizer detecting a magnetic field type stylus pen.

The audio modules 303 and 314 may include a microphone hole and a speaker hole. In some embodiments, a plurality of microphones may be arranged to sense the direction of the sound. In some embodiments, a speaker hole and a microphone hole may be implemented as one hole, or a speaker may be included without a speaker hole (e.g., a piezo speaker). The speaker hole may include an external speaker hole and a call receiver hole.

The electronic device 300 may generate an electrical signal or data value corresponding to an internal operating state or an external environmental state by including a sensor module. The sensor module may include, for example, a proximity sensor disposed on the first surface 310A of the housing 310, a fingerprint sensor integrated or adjacent to the display 301, and/or a biometric sensor (e.g., an HRM sensor) disposed on the second surface 310B. The electronic device 300 includes a sensor module, for example, a gesture sensor, a gyro sensor, an air pressure sensor, a magnetic sensor, an acceleration sensor, a grip sensor, a color sensor, an infrared (IR) sensor, a biosensor, a temperature sensor, It may further include at least one of a humidity sensor or an illumination sensor.

The camera modules 305, 312, 313, and 306 include a first camera device 305 disposed on the first surface 310A of the electronic device 300, a second camera device 312, 313, and/or flash 306 disposed on the second surface 310B. The camera devices 305, 312, 313 may include one or more lenses, an image sensor, and/or an image signal processor. The flash 306 may include, for example, a light-emitting diode or a xenon lamp. In some embodiments, two or more lenses (infrared camera, wide-angle and telephoto lenses) and image sensors may be disposed on one side of the electronic device 300.

The key input device 317 may be disposed on the side 310C of the housing 310. In other embodiments, the electronic device 300 may not include some or all of the above-mentioned key input devices 317, and the key input devices 317 not included may be implemented in another form such as soft keys on the display 301. In some embodiments, the key input device may include at least a portion of the fingerprint sensor 316.

The connector hole 308 may accommodate a connector for transmitting and receiving power and/or data with an external electronic device, and/or a connector for transmitting and receiving audio signals with an external electronic device. For example, the connector hole 308 may include a USB connector or an earphone jack.

Figure 4:
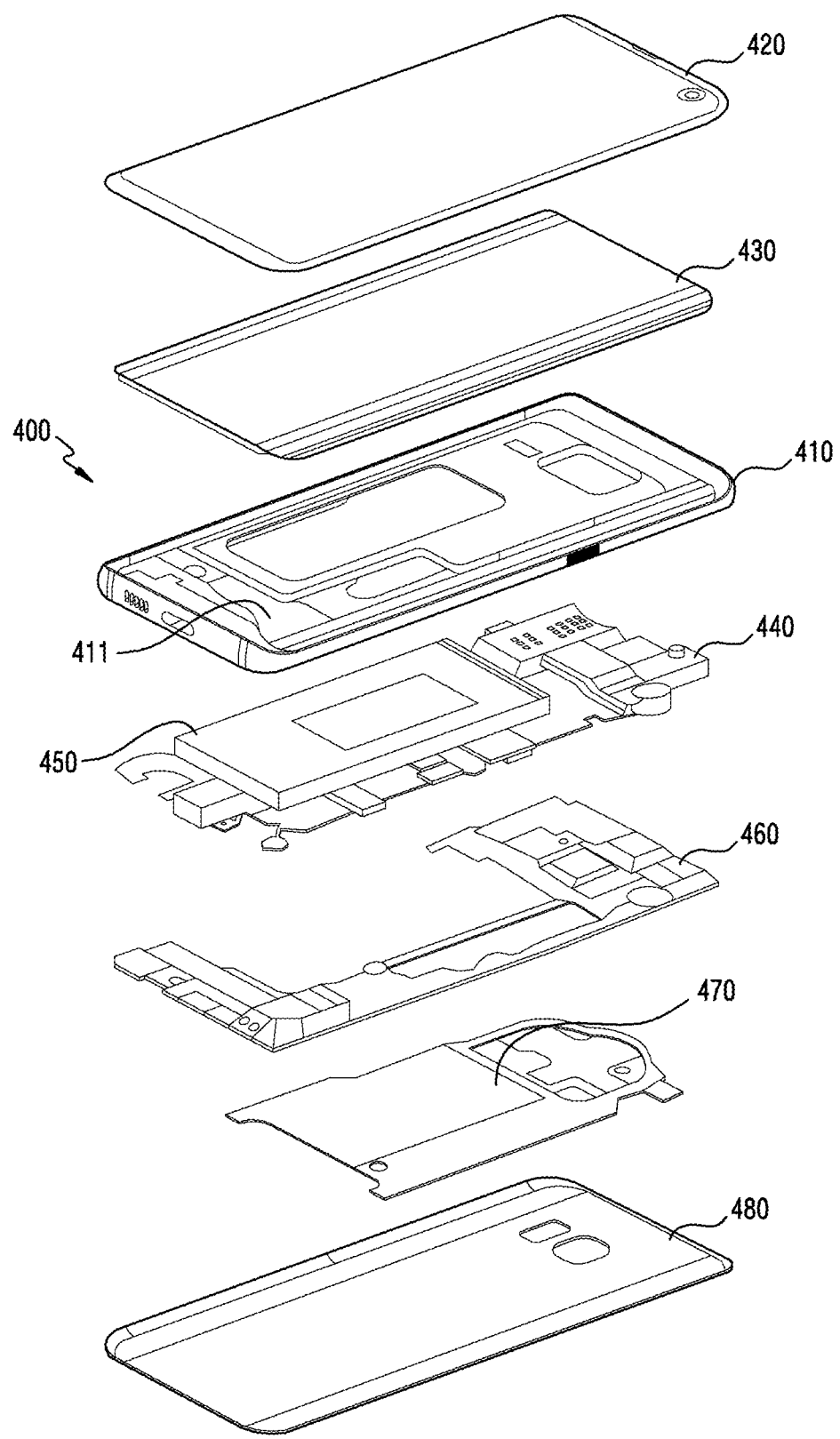
FIG. 4 illustrates, in exploded perspective view, the example electronic device of FIG. 3A.

FIG. 4 illustrates the example electronic device of FIG. 3A in an exploded perspective view. Referring to the non-limiting example of FIG. 4, the electronic device 400 may include a lateral bezel structure 410, a first support member 411 (e.g., a bracket), a front plate 420, a display 430, a printed circuit board 440, a battery 450, a second support member 460 (e.g., a rear case), an antenna module 470, and a rear plate 480. In some embodiments, at least one of the components (e.g., the first support member 411 or the second support member 460) may be omitted from the electronic device 400, or a different component may be further included in the electronic device 400. At least one of the components of the electronic device 400 may be the same as or similar to at least one of the components of the electronic device 300 of FIG. 3A or 3B, and a redundant description is omitted hereinafter.

According to various embodiments, first support member 411 may be disposed in the electronic device 400 and may be connected to the lateral bezel structure 410 or may be integrally formed with the lateral bezel structure 410. The first support member 411 may be formed of, for example, a metallic material and/or a nonmetallic material (e.g., a polymer). The first support member 411 may be coupled with the display 430 on one surface thereof and may be coupled with the printed circuit board 440 on the other surface thereof. A processor, a memory, and/or an interface may be mounted on the printed circuit board 440. The processor may include, for example, one or more of a central processing unit, an application processor, a graphics processing unit, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may, for example, electrically or physically connect the electronic device 400 to an external electronic device and may include a USB connector, an SD card/MMC connector, or an audio connector.

The battery 450 is a device for supplying power to at least one component of the electronic device 400 and may include, for example, a non-rechargeable primary cell, a rechargeable secondary cell, or a fuel cell. At least a portion of the battery 450 may be disposed in substantially the same plane as, for example, the printed circuit board 440. The battery 450 may be integrally disposed in the electronic device 400 or may be detachably disposed in the electronic device 400.

The antenna module 470 may be disposed between the rear plate 480 and the battery 450. The antenna module 470 may include, for example, a near-field communication (NFC) antenna, a wireless charging antenna, and/or a magnetic secure transmission (MST) antenna. The antenna module 470 may, for example, perform short-range communication with an external device or may wirelessly transmit and receive power required for charging. In another embodiment, an antenna structure may be formed by the lateral bezel structure 410 and/or a portion of the first support member 411 or a combination thereof.

Figure 5:
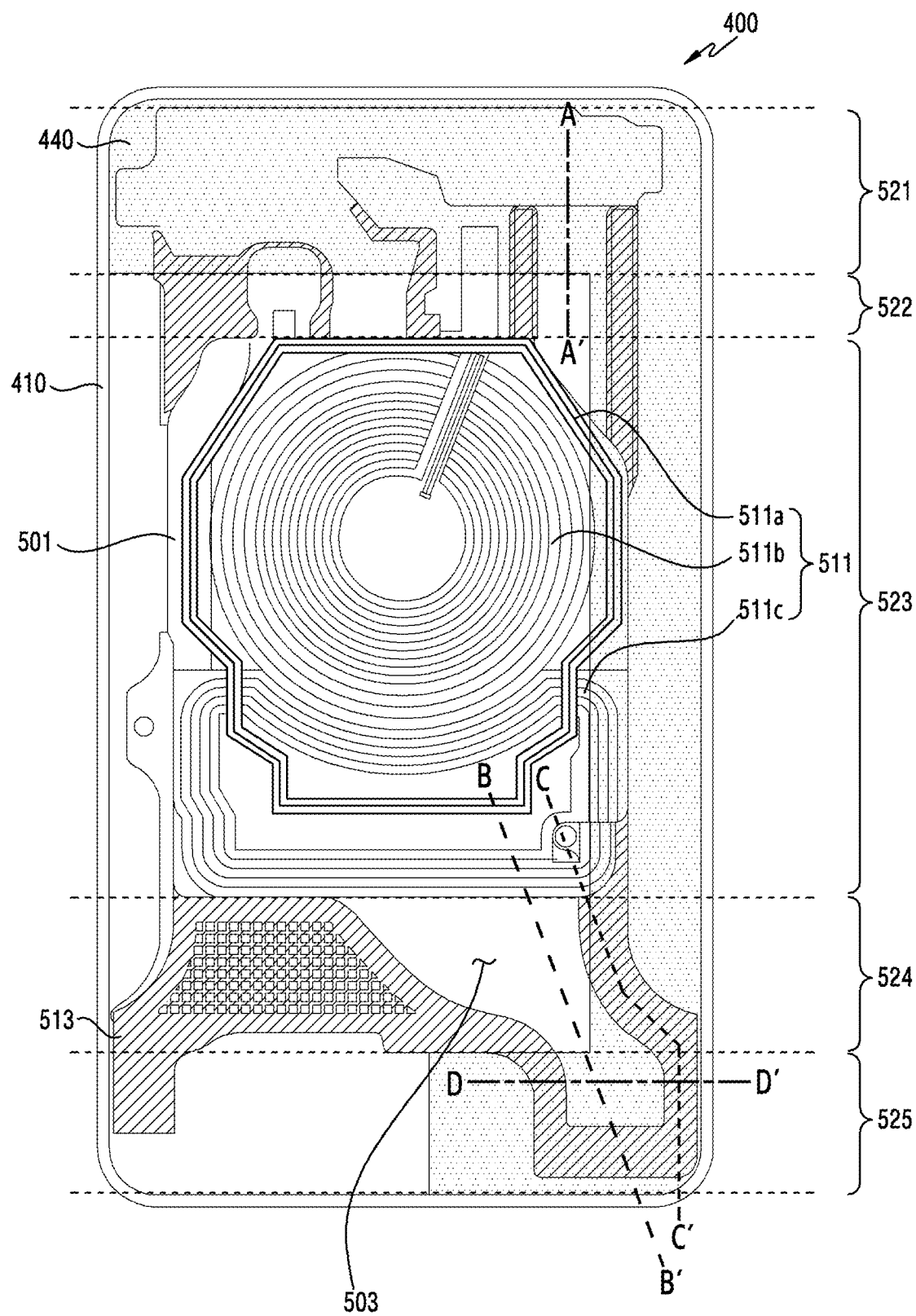
FIG. 5 illustrates an example of the structure of an FPCB antenna module according to various embodiments of this disclosure.
Figure 6:
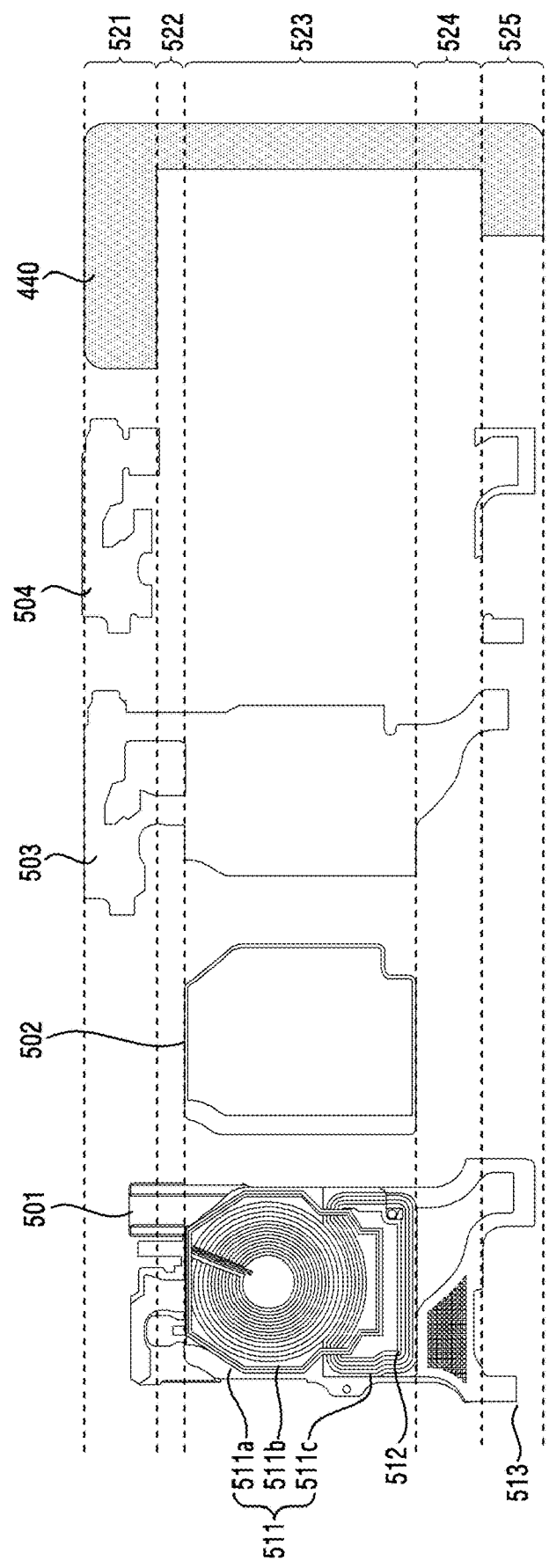
FIG. 6 illustrates, in exploded view layers forming the FPCB antenna module of FIG. 5.

FIG. 5 illustrates an example of a FPCB antenna module and layers attached to an FPCB antenna module according to certain embodiments. FIG. 6 illustrates, in an exploded view, an FPCB antenna module and layers attached to an FPCB antenna module according to certain embodiments. Referring to the non-limiting examples of FIG. 5 and FIG. 6, an electronic device 400 according to certain embodiments may include a housing 401, an FPCB antenna module 501, a shielding member 502, a radiating sheet 503, a bonding member 504, and a printed circuit board 440.

According to certain embodiments, the housing 401 may form an internal space of the electronic device 400. For example, the housing 401 may include a lateral bezel structure 410 that forms a lateral side of the electronic device 400. The FPCB antenna module 501, the shielding member 502, the radiating sheet 503, the bonding member 504, and the printed circuit board 440 may be stacked in the internal space of the housing 401.

According to certain embodiments, the FPCB antenna module 501 may include an antenna pattern 511 and a nonconductive layer 512 surrounding the antenna pattern 511.

According to certain embodiments, the antenna pattern 511 may include a wireless charging pattern 511*a*, a near-field communication pattern 511*b*, and a magnetic secure transmission pattern 511*c*. The wireless charging pattern 511*a*, the near-field communication pattern 511*b*, and the magnetic secure transmission pattern 511*c* may handle signals of different respective frequency bands.

According to certain embodiments, an electric current induced by an external charging device may be generated in the wireless charging pattern 511*a*, and a battery (e.g., the battery 450 of FIG. 4) may be charged with the induced electric current. According to certain embodiments, the wireless charging pattern may be patterned with a conductive material on both sides of one base layer. According to certain embodiments, the wireless charging pattern 511*a* may be formed in concentric circles and may be electrically connected to the printed circuit board.

According to certain embodiments, the near-field communication pattern 511*b* may be disposed along the periphery of the wireless charging pattern 511*a*. The near-field communication pattern 511*b* may be patterned on both sides or one side of a base layer. The near-field communication pattern 511*b* may be electrically connected to the printed circuit board. The electronic device 400 may transmit and receive a signal to and from an external electronic device through the near-field communication pattern 511*b*.

According to certain embodiments, the magnetic secure transmission pattern 511*c* may be disposed in a region adjacent to the wireless charging pattern 511*a*. According to certain embodiments, the magnetic secure transmission pattern 511*c* may be formed to face one edge of the housing from the wireless charging pattern 511*a*. According to certain embodiments, the magnetic secure transmission pattern 511*c* may be electrically connected to the printed circuit board, and the electronic device 400 may generate a specified magnetic field stored in a memory (e.g., the memory 130 of FIG. 1) to transmit a signal to an external device through the magnetic secure transmission pattern 511*c*.

When an electric current flows through the antenna pattern 511 according to an antenna operation, heat may be generated due to resistance. When the generated heat is not properly radiated, the heat may accumulate in the electronic device 400, thus causing a deterioration in performance. Further, when the housing (e.g., a second side 310B of FIG. 3B) of the electronic device 400 is heated by the heat generated by the antenna pattern 511, the user may experience discomfort when using the electronic device 400. To discharge the heat generated in the antenna pattern 511, the radiating sheet 503 may be attached to the antenna pattern 511.

According to certain embodiments, the nonconductive layer 512 may extend from a third region 523 corresponding to the antenna pattern 511 to a first region 521 and a fifth region 525 in which an electronic component is disposed. An extended portion of the nonconductive layer 512 may be disposed to overlap the radiating sheet 503 and/or the electronic component. The extended portion of the nonconductive layer 512 may be attached to a portion of the electronic component through the bonding member 504.

According to one embodiment, the FPCB antenna module 501 may include an additional conductive pattern 513. According to certain embodiments, the FPCB antenna module 501 may include the additional conductive pattern 513 in a portion extending to the first region 521 or the fifth region 525. The additional conductive pattern 513 may be disposed in first, second, fourth, and fifth regions 521, 522, 524, and 525 of the FPCB antenna module 501. The additional conductive pattern 513 may be disposed along the outer boundary of the radiating sheet 503.

In certain embodiments, the additional conductive pattern 513 may not function as a conducting wire. In another embodiment, the additional conductive pattern 513 may be electrically connected to the printed circuit board 440.

In certain embodiments, the shielding member 502 may be attached to one side of the antenna pattern 511. For example, the battery 450, the printed circuit board 440, or the support member 360 may be disposed on one surface of the shielding member 502, and the wireless charging pattern 511*a*, the near-field communication pattern 511*b*, or the magnetic secure transmission pattern 511*c* may be disposed on the other surface of the shielding member 502.

According to certain embodiments, the shielding member 502 may minimize the impact of an electronic component on the antenna pattern 511. Further, the shielding member 502 may concentrate a magnetic field generated by the antenna pattern 511 on one side of the shielding member 502. For example, the shielding member 502 may concentrate the magnetic field generated in the wireless charging pattern 511*a* on a surface where a rear plate (e.g., the rear plate 480 of FIG. 4) of the housing is disposed, thereby increasing the charging efficiency of the battery. In another example, the shielding member 502 may concentrate the magnetic field generated in the near-field communication pattern 511b on the rear plate, thus enabling the electronic device 400 to effectively perform near-field communication (NFC) with an external electronic device (e.g., the electronic device 102 of FIG. 1).

According to certain embodiments, a plurality of shielding members 502 may be disposed to form layers. The shielding member 502 may have a different thickness depending on the position where the shielding member 502 is disposed and may be arranged in different forms.

In certain embodiments, the shielding member 502 may be formed of a material having a high permeability and a low loss tangent in the band of the near-field communication pattern 511b and the wireless charging pattern 511a. The shielding member 502 may include a microcrystalline material and may have a high permeability and a low loss tangent in the band of the near-field communication pattern 511b and the wireless charging pattern 511a of about 10 kHz to 15 MHz. Therefore, the shielding member 502 may be used as a ferromagnetic body in the band of the near-field communication pattern 511b and the wireless charging pattern 511a of about 10 kHz to 15 MHz.

According to certain embodiments, an electronic component may be mounted or assembled on the printed circuit board 440 disposed in a rear portion of the housing 401. The electronic component may include a processor (e.g., the processor 120 of FIG. 1), a memory (e.g., the memory 130 of FIG. 1), a display drive integrated (DDI) circuit, and a speaker module mounted on the printed circuit board 440.

According to certain embodiments, the printed circuit board 440 may extend from the first region 521 to the fifth region 525 along one edge of the housing 401. The electronic component on the printed circuit board 440 may be attached to or may be in contact with one surface of the radiating sheet 503 and/or the FPCB antenna module 501.

According to certain embodiments, a portion of the radiating sheet 503 may be attached to one surface of the shielding member 502. In certain embodiments, a portion of the radiating sheet 503 may be attached to a portion of the FPCB antenna module 501. In certain embodiments, a portion of the radiating sheet 503 may be attached to a portion of the electronic component. According to certain embodiments, the radiating sheet 503 may extend from the third region 523, where the antenna pattern 511 is disposed, to the first region 521 and/or the fifth region 525, where the electronic device 505 is disposed.

In the illustrated embodiment, the radiating sheet 503 is formed of one layer but is not limited thereto. In another embodiment, the radiating sheet 503 may be formed of a plurality of layers. The plurality of layers forming the radiating sheet 503 may have the same thickness, or at least one of the plurality of layers may have a different thickness.

In certain embodiments, the radiating sheet 503 may include graphite having excellent heat radiation performance in order to dissipate the heat generated in the wireless charging pattern 511a or the battery.

In certain embodiments, the bonding member 504 may be disposed between the radiating sheet 503 and the electronic component on the printed circuit board 440. In another embodiment, a portion of the bonding member 504 may be disposed between the FPCB antenna module 501 and the printed circuit board 440, and another portion thereof may be disposed between the printed circuit board 440 and the radiating sheet 503. In still another embodiment, the bonding member 504 may be disposed between the radiating sheet 503 (or the FPCB antenna module 501) and a structure inside the housing 401. Due to the bonding member 504, the FPCB antenna module 501 may be fixed in the housing, thus preventing the FPCB antenna module 501 from moving in the housing.

Figure 7:
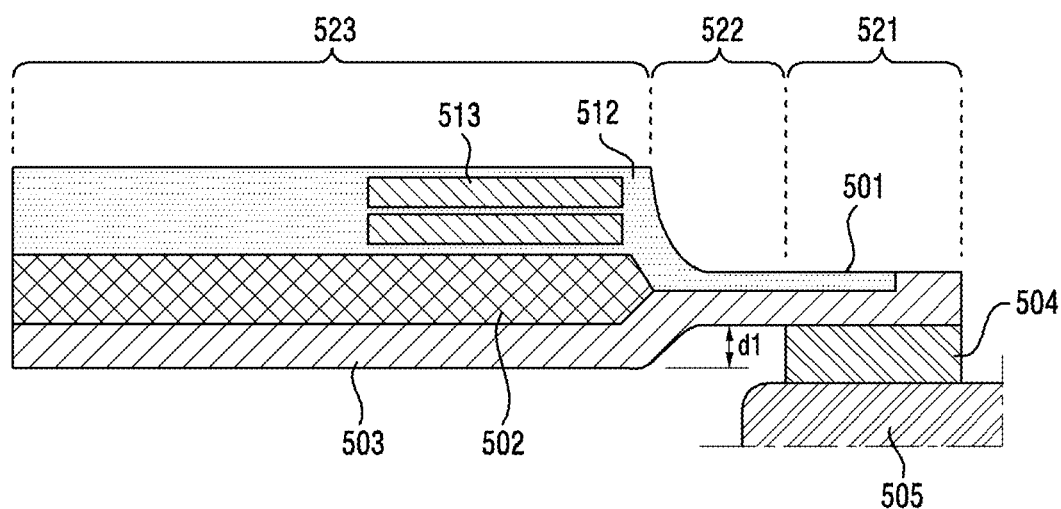
FIG. 7 illustrates the FPCB antenna of the example of FIG. 5 along a cross-sectional view taken along line A-A' in FIG. 5.

FIG. 7 illustrates, in cross-sectional view, the example FPCB antenna module 501 taken along line A-A' in FIG. 5.

According to certain embodiments, a portion of the radiating sheet 503 may be attached to the FPCB antenna module 501 (or the shielding member 502 attached to the FPCB antenna module 501), and another portion thereof may be attached to the electronic component 505. According to the illustrated embodiment, the radiating sheet may be attached to the shielding member 502 in the third region 523, may be attached to the FPCB antenna module 501 in the second region 522, and may be disposed between the FPCB antenna module 501 and the electronic component 505 in the first region 521. In certain embodiments, the bonding member 504 may be disposed between the radiating sheet 503 and the electronic component 505. The bonding member 504 may fix the FPCB antenna module 501 attached to the radiating sheet 503 in the housing.

The radiating sheet 503 may be disposed across the three regions 521, 522, and 523, thereby improving the heat radiation performance of the electronic device 400. For example, the heat generated by the antenna pattern 511 in the third region 523 may spread not only to the radiating sheet 503 in the third region 523 but also to the radiating sheet in the first region 521 and the second region 522, thereby being radiated relatively quickly. In another example, the heat generated by the electronic component 505 in the first region 521 may spread not only in the radiating sheet 503 in the first region 521 but also to the radiating sheet 503 in the second region 522 and the third region 523, thereby being relatively quickly radiated.

According to certain embodiments, a relative movement may occur between the FPCB antenna module 501 and the electronic component 505 due to an external impact applied to the electronic device 400. Due to this movement, stress may be concentrated on the radiating sheet 503 in the second region 522. In particular, when there is a step d1 in the radiating sheet 503 in the second region 522, the radiating sheet 503 may be more vulnerable to the stress due to the relative movement that occurs between the FPCB antenna module 501 and the electronic component 505, compared to the case where there is no step.

In certain embodiments, the nonconductive layer 512 of the FPCB antenna module 501 may extend from the third region 523 to the first region 521 through the second region 522. When the nonconductive layer 512 extends from the third region 523 to the second region 522 and the first region 521, the extended portion of the nonconductive layer 512 may withstand, along with the radiating sheet 503, the stress due to the relative movement between the first region 521 and the third region 523. Therefore, damage to the radiating sheet 503 due to a relative movement occurring between the FPCB antenna module 501 and the electronic component 505 may be prevented.

According to certain embodiments, the FPCB antenna module 501 may include the nonconductive layer 512 and the antenna pattern 511. In certain embodiments, the antenna pattern 511 and/or the nonconductive layer 512 may be formed of a plurality of layers. For example, as illustrated in the embodiment, the antenna pattern 511 may include two layers.

According to certain embodiments, the FPCB antenna module 501 may extend from the region 523 in which the antenna pattern 511 is disposed to the region 521 in which the electronic component 505, which is an additional heat-generating source, is disposed or to a portion of the region 521. In one embodiment, the extended portion may include only the nonconductive layer 512 without a conductive pattern (e.g., the antenna pattern 511).

According to certain embodiments, the shielding member 502 may be disposed on one surface of the FPCB antenna module 501. In certain embodiments, the shielding member 502 may be disposed to overlap the antenna pattern 511 of the FPCB antenna module 501. For example, the shielding member 502 may be attached to a region in which the wireless charging pattern 511a, the near-field communication pattern 511b, and the magnetic secure transmission pattern 511c of the FPCB antenna module 501 are positioned.

Figure 8:
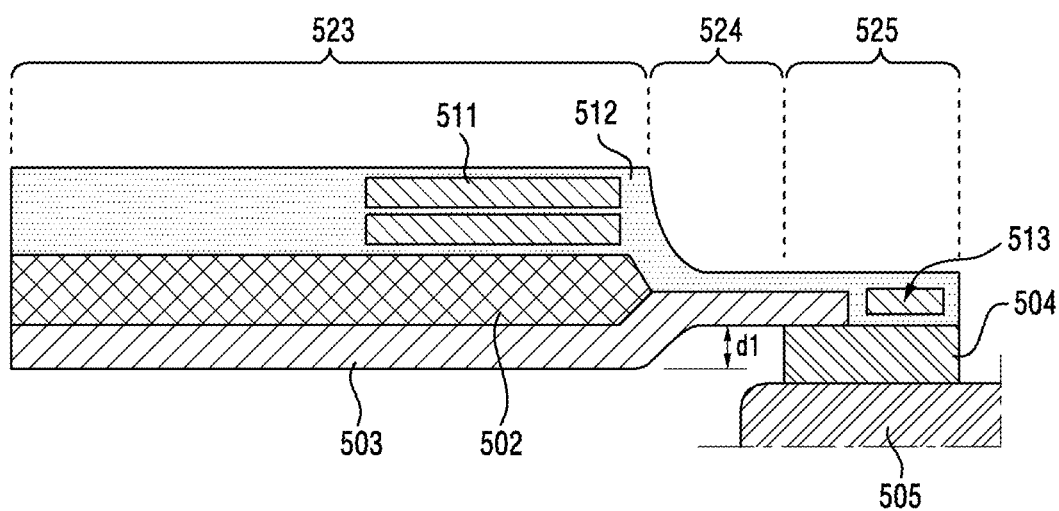
FIG. 8 illustrates the FPCB antenna of the example of FIG. 5 along a cross-sectional view taken along line B-B' in FIG. 5.

FIG. 8 illustrates, in cross-sectional view the example FPCB antenna module 501 taken along line B-B' of FIG. 5.

According to certain embodiments, the radiating sheet 503 may be disposed in the third region 523, the fourth region 524, and the fifth region 525. For example, a portion of the radiating sheet 503 may be attached to the FPCB antenna module 501 and another portion thereof may be attached to the electronic component 505. According to various embodiments, the radiating sheet 503 may be attached to a portion of the electronic component 505.

The radiating sheet 503 may be disposed across the third to fifth regions 523, 524, and 525, thereby improving the heat radiation performance of the electronic device 400. For example, the heat generated by the antenna pattern 511 in the third region 523 may spread not only in the radiating sheet 503 in the third region 523 but also to the radiating sheet in the fourth region 524 and the fifth region 525, thereby being relatively quickly radiated. In another example, the heat generated by the electronic component 505 in the fifth region 525 may spread not only in the radiating sheet 503 in the fifth region 525 but also to the radiating sheet 503 in the third region 523 and the fourth region 524, thereby being relatively quickly radiated.

According to certain embodiments, the bonding member 504 may be disposed between the radiating sheet 503 and the electronic component 505. The bonding member 504 may fix the FPCB antenna module 501 attached to the radiating sheet 503 in the housing. According to certain embodiments, the bonding member 504 may be disposed between the extended FPCB antenna module 501 and the electronic component 505.

In certain embodiments, when the nonconductive layer 512 extends to the fifth region 525, the nonconductive layer 512 may withstand, along with the radiating sheet 503, stress due to a relative movement between the third region 523 and the fifth region 525. According to certain embodiments, the FPCB antenna module 501 may further include an additional conductive pattern 513 in the extended portion. Referring to the non-limiting example of FIG. 11, the portion of the radiating sheet 503 in the fifth region 525 may be surrounded by the additional conductive pattern 513. The nonconductive layer 512 and the further included additional conductive pattern 513 may withstand, along with the radiating sheet 503, stress due to the relative movement between the third region 523 and the fifth region 525. Therefore, damage to the radiating sheet 503 due to a relative movement occurring between the FPCB antenna module 501 and the electronic component 505 may be prevented.

According to certain embodiments, the FPCB antenna module 501 may include the nonconductive layer 512, the antenna pattern 511, and the additional conductive pattern 513.

In certain embodiments, the nonconductive layer 512 of the FPCB antenna module 501 may extend from the third region 523, in which the antenna pattern 511 is formed, to the fifth region 525, in which the electronic component 505, which is an additional heat-generating source, is disposed, or to a portion of the fifth region 525.

In certain embodiments, the FPCB antenna module 501 may include the additional conductive pattern 513 in the extended portion. In certain embodiments, the additional conductive pattern 513 may be electrically disconnected from the antenna pattern 511 disposed in the third region. In another embodiment, the additional conductive pattern 513 may be electrically connected to the printed circuit board 440 so as to function as an electronic component (e.g., an antenna).

According to certain embodiments, the additional conductive pattern 513 may be disposed at a distance from the radiating sheet 503. For example, the additional conductive pattern 513 may be spaced apart from an outer boundary of the radiating sheet 503.

Figure 9:
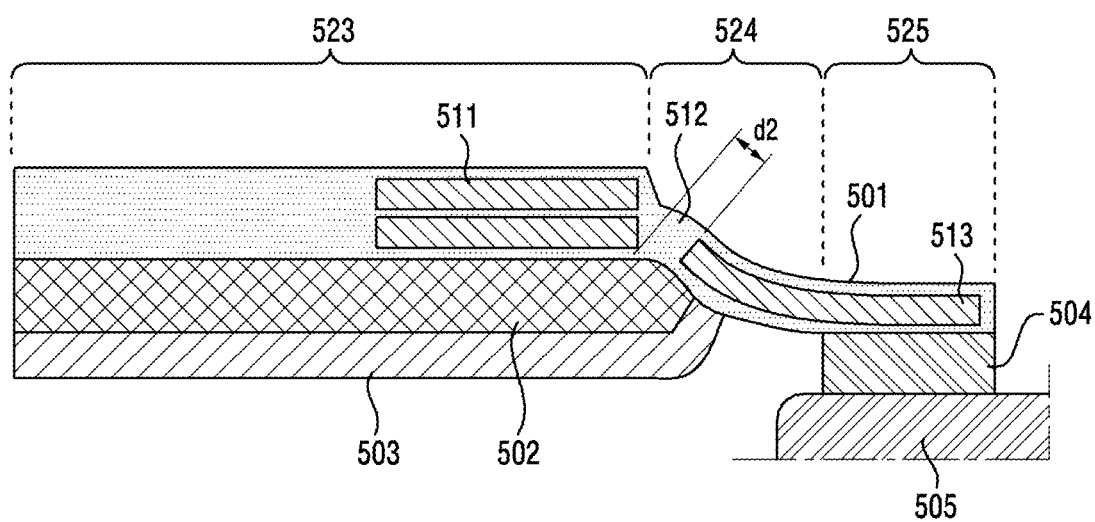
FIG. 9 illustrates the FPCB antenna of the example of FIG. 5 along a cross-sectional view taken along line C-C' in FIG. 5.

FIG. 9 illustrates, in cross-sectional view the example FPCB antenna module 501 taken along line C-C' in FIG. 5.

According to certain embodiments, the FPCB antenna module 501 may include the nonconductive layer 512, the antenna pattern 511, and the additional conductive pattern 513. In certain embodiments, the FPCB antenna module 501 may extend from the region 523 in which the antenna pattern 511 is formed to the region 525 in which the electronic component 505, which is an additional heat-generating source, is disposed or to a portion of the region 525.

According to certain embodiments, the FPCB antenna module 501 may include the additional conductive pattern 513 in portions extending to the fourth region 524 and the fifth region 525. In certain embodiments, the additional conductive pattern 513 may be electrically disconnected (d2) from the antenna pattern 511.

According to certain embodiments, the radiating sheet 503 may be disposed to overlap the FPCB antenna module 501. The radiating sheet 503 may be disposed under the shielding member 502 and may receive heat from the FPCB antenna module 501 through the shielding member. The radiating sheet 503 may spread the received heat into the radiating sheet 503, thereby preventing the heat from accumulating in the FPCB antenna module 501.

According to certain embodiments, the bonding member 504 may be disposed between the FPCB antenna module 501 and the electronic component 505. Although the FPCB antenna module 501 is attached to the electronic component 505 in the illustrated embodiment, the embodiment is not limited thereto. For example, the FPCB antenna module 501 may be attached to an apparatus inside the housing. The bonding member 504 may fix the FPCB antenna module 501 in the housing. By fixing the FPCB antenna module 501 in the housing, the FPCB antenna module 501 may be prevented from moving in the housing, and thus the FPCB antenna module 501 may operate normally.

Figure 10:
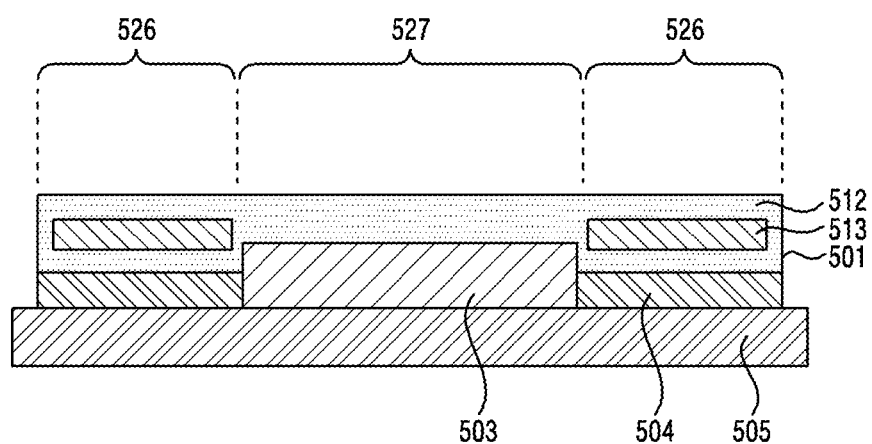
FIG. 10 illustrates the FPCB antenna of the example of FIG. 5 along a cross-sectional view taken along line D-D' in FIG. 5.

FIG. 10 illustrates, in cross-sectional view, the example FPCB antenna module 501 taken along line D-D' in FIG. 5. The non-limiting example of FIG. 10 shows a cross section of the FPCB antenna module 501 extending from the third region 523 to the fifth region 525, taken in a direction perpendicular to the extending direction.

The additional conductive pattern 513 may be disposed in a portion of the nonconductive layer 512. According to certain embodiments, the additional conductive pattern 513 may be disposed at a distance from the radiating sheet 503. In certain embodiments, when the FPCB antenna module 501 is viewed from above, the radiating sheet 503 and the additional conductive pattern 513 may not overlap. For example, the radiating sheet 503 may be disposed under a portion 527 of the FPCB antenna module 501 including only the nonconductive layer 512. In certain embodiments, the electronic component 505 may be attached to a portion 526 including the additional conductive pattern 513 through the bonding member 504.

Since the additional conductive pattern 513 is disposed at a distance from the radiating sheet 503, the thickness of a component in which the radiating sheet 503 and the FPCB antenna module 501 are combined may be kept relatively constant. By reducing the thickness of the component in which the radiating sheet 503 and the FPCB antenna module 501 are combined, the internal space of the housing 500 may be efficiently used.

Further, since the radiating sheet 503 is direct in contact with the electronic component 505 without the bonding member 504, the radiating sheet 503 may be less likely to be damaged when the FPCB antenna module 501 is separated from the electronic component 505.

Figure 11:
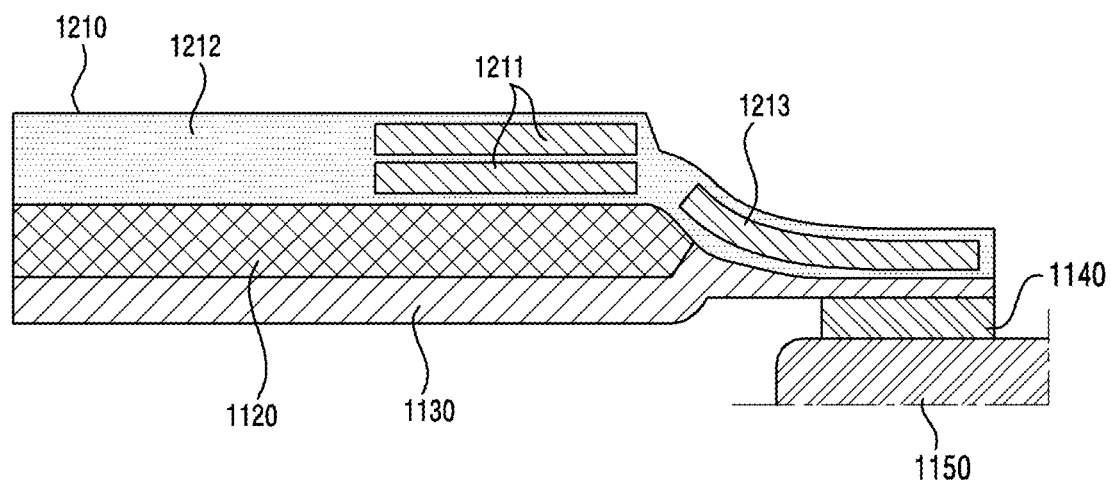
FIG. 11 illustrates an example of a modified stacked structure of an FPCB antenna according to certain embodiments of this disclosure.

FIG. 11 illustrates an example of a modified stacked structure of an FPCB antenna according to certain embodiments. FIG. 11 illustrates certain embodiments in which an additional conductive pattern is disposed to overlap a radiating sheet.

According to certain embodiments, the FPCB antenna module 1210 may include a nonconductive layer 1212, an antenna pattern 1211, and an additional conductive pattern 1213. In certain embodiments, the FPCB antenna module 1210 may extend from a region in which the conductive pattern 12111 is formed to a region in which an electronic component 1150, which is an additional heat-generating source, is disposed.

According to certain embodiments, a shielding member 1120 may be disposed on one surface of the FPCB antenna module 1210. The shielding member 1120 may be attached to a region corresponding to the conductive pattern 1111 of the FPCB antenna module 1210.

According to certain embodiments, a portion of a radiating sheet 1130 may be attached to the FPCB antenna module 12110, and another portion thereof may be attached to the electronic component 1150. For example, the radiating sheet 1130 may extend from the region in which the conductive pattern 1211 of the FPCB antenna module 1210 is disposed to the region in which the electronic component 1150 is disposed.

By extending the radiating sheet 1130, the heat radiation performance of the radiating sheet 1130 may be improved. For example, the heat generated by the antenna pattern 1211 may spread not only in the radiating sheet 1130 in the region corresponding to the antenna pattern 1211 but also to the radiating sheet 1130 in the region in which the electronic component 1150 is disposed, thereby being relatively quickly radiated.

According to certain embodiments, a bonding member 1140 may be disposed between the radiating sheet 1130 and the electronic component 1150. The bonding member 1140 may fix the FPCB antenna module 1210 disposed on the radiating sheet 1130 in a housing. By fixing the FPCB antenna module 1210 in the housing, the FPCB antenna module 1210 may be prevented from moving in the housing.

The nonconductive layer 1212 of the FPCB antenna module 1210 may extend to the region in which the electronic component 1150 is disposed. According to certain embodiments, the FPCB antenna module 1210 may further include the additional conductive pattern 1213 in the extended portion. The additional conductive pattern 1213 may overlap the radiating sheet 1130. The FPCB antenna module 1110 including the nonconductive layer 1212 and the additional conductive pattern 1213 may withstand, along with the radiating sheet 1130, stress caused by a relative movement between the FPCB antenna module 1210 and the electronic component 1150.

An electronic device (e.g., the electronic device 101 of FIG. 1) according to various embodiments may include: a housing (e.g., the housing 401 of FIG. 5) configured to form an internal space; a radiating sheet (e.g., the radiating sheet 503 of FIG. 5) configured to be disposed in the internal space; at least one electronic component (e.g., the electronic component 505 of FIG. 7) configured to be disposed in the internal space and to be connected to the radiating sheet; and an FPCB antenna module (e.g., the FPCB antenna module 501 of FIG. 7) configured to be disposed on the radiating sheet and to include an antenna pattern (e.g., the antenna pattern 511 of FIG. 7) and a nonconductive layer (e.g., the nonconductive layer 512 of FIG. 7) configured to surround the antenna pattern, wherein the nonconductive layer may extend to a region in which the electronic component is positioned.

According to certain embodiments, the electronic device may further include a shielding member (e.g., the shielding member 502 of FIG. 6) configured to be stacked between the radiating sheet and the FPCB antenna module.

According to certain embodiments, the electronic device may further include a bonding member (e.g., the bonding member 504 of FIG. 6) configured to be disposed between the radiating sheet and the electronic component.

According to certain embodiments, the electronic device may further include a bonding member configured to be disposed between the FPCB antenna module and the electronic component.

According to certain embodiments, the FPCB antenna module may further include an additional conductive pattern (e.g., the additional conductive pattern 513 of FIG. 5) in a portion extending to the electronic component.

According to certain embodiments, the additional conductive pattern may extend from a region adjacent to the antenna pattern to the region in which the electronic component is positioned.

According to certain embodiments, the additional conductive pattern may be electrically disconnected from the antenna pattern.

According to certain embodiments, the additional conductive pattern may be spaced apart from a boundary of the radiating sheet when the FPCB antenna module is viewed from above.

According to certain embodiments, the electronic device may include a step between a portion of the radiating sheet attached to the antenna pattern and a portion thereof attached to the electronic component.

According to certain embodiments, the antenna pattern of the electronic device may include an antenna that operates as at least one of a wireless charging pattern (e.g., the wireless charging pattern 511a of FIG. 6), a near-field communication (NFC) pattern (e.g., the near-field communication pattern 511b), or a magnetic secure transmission (MST) pattern (e.g., the magnetic secure transmission pattern 511c).

According to certain embodiments, the FPCB antenna module of the electronic device may face the electronic component with respect to the radiating sheet in a region where the bonding member is positioned.

According to certain embodiments, the electronic component of the electronic device may further include a portion of a main printed circuit board (PCB) or an electronic component.

According to certain embodiments, an electronic device (e.g., the electronic device 400 of FIG. 5) may include: a housing (e.g., the housing 401 of FIG. 5) configured to form an internal space; a printed circuit board (PCB, e.g., the printed circuit board 440 of FIG. 5) configured to be disposed in the internal space; an electronic component (e.g., the electronic component 505 of FIG. 6) configured to be disposed in the internal space and to be electrically connected to the PCB; a radiating sheet (e.g., the radiating sheet 503 of FIG. 5) configured to be partly or entirely in contact with the electronic component and the PCB; and an FPCB antenna module (e.g., the FPCB antenna module 501 of FIG. 5) configured to include an antenna pattern (e.g., the antenna pattern 511 of FIG. 5) so as to electromagnetically operate in connection with an external device of the electronic device and to be electrically connected to the PCB and a nonconductive layer (e.g., the nonconductive layer 512 of FIG. 5) configured to surround the antenna pattern, and to be disposed on the radiating sheet, wherein the nonconductive layer may extend on the radiating sheet to the PCB or the electronic component.

According to certain embodiments, the electronic device may further include a shielding member (e.g., the shielding member 502 of FIG. 6) configured to be disposed between the radiating sheet and the FPCB antenna module.

According to certain embodiments, the electronic device may further include a bonding member (e.g., the bonding member 504 of FIG. 6) configured to be disposed between the radiating sheet and the electronic component.

According to certain embodiments, the electronic device may further include a bonding member configured to be disposed between the FPCB antenna module and the electronic component.

According to certain embodiments, the electronic device may further include an additional conductive pattern (e.g., the additional conductive pattern 513 of FIG. 5) in addition to the nonconductive layer extending to a region in which the electronic component is positioned.

According to certain embodiments, the electronic component may include a speaker.

According to certain embodiments, the additional conductive pattern of the electronic device may be spaced apart from the radiating sheet and may extend along an edge of the radiating sheet.

According to certain embodiments, the additional conductive pattern of the electronic device may be electrically connected to the printed circuit board.

In the specific embodiments of this disclosure described above, the elements included in the invention have been represented singular or plural in accordance with the specific embodiments shown. It should be understood, however, that the singular or plural representations are selected appropriately according to the situations presented for the convenience of description, and the disclosure is not limited to the singular or plural constituent elements, and may be composed of a plurality of elements even if they are expressed.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing configured to form an internal space;
   a radiating sheet configured to be disposed in the internal space;
   at least one electronic component configured to be disposed in the internal space and to be connected to the radiating sheet; and
   a flexible printed circuit board (FPCB) antenna module configured to be disposed on the radiating sheet and to comprise an antenna pattern and a nonconductive layer, the nonconductive layer being configured to surround the antenna pattern,
   wherein the nonconductive layer extends to a region in which the electronic component is positioned.

2. The electronic device of claim 1, further comprising:
   a shielding member configured to be stacked between the radiating sheet and the FPCB antenna module.

3. The electronic device of claim 1, further comprising:
   a bonding member configured to be disposed between the radiating sheet and the electronic component.

4. The electronic device of claim 1, further comprising:
   a bonding member configured to be disposed between the FPCB antenna module and the electronic component.

5. The electronic device of claim 1, wherein the FPCB antenna module further comprises an additional conductive pattern in a portion that extends to the electronic component.

6. The electronic device of claim 5, wherein the additional conductive pattern extends from a region adjacent to the antenna pattern to the region in which the electronic component is positioned.

7. The electronic device of claim 5, wherein the additional conductive pattern is electrically disconnected from the antenna pattern.

8. The electronic device of claim 5, wherein the additional conductive pattern is spaced apart from a boundary of the radiating sheet when the FPCB antenna module is viewed from above.

9. The electronic device of claim 5, wherein the additional conductive pattern is formed along a boundary of the portion of the FPCB antenna module that extends to the electronic component.

10. The electronic device of claim 1, wherein the antenna pattern comprises an antenna that operates as at least one of a near-field communication (NFC) pattern or a magnetic secure transmission (MST) pattern.

11. The electronic device of claim 1, wherein the FPCB antenna module is disposed on a surface of the radiating sheet, and the electronic component is disposed on a surface looking in a different direction from that of the surface of the radiating sheet.

12. The electronic device of claim 1, wherein the electronic component further comprises a portion of a printed circuit board (PCB) or an electronic component.

13. The electronic device of claim 1, wherein the radiating sheet comprises a step between a portion thereof attached to the antenna pattern and a portion thereof attached to the electronic component.

14. The electronic device of claim 1, further comprising:
   a bonding member configured to be disposed between a structure in the housing and an extended portion of the FPCB antenna module.

15. The electronic device of claim 1, wherein a portion of the electronic component is attached to the radiating sheet, and another portion thereof is attached to an extended portion of the FPCB antenna module.

16. An electronic device comprising:
a housing configured to form an internal space;
a printed circuit board (PCB) configured to be disposed in the internal space;
an electronic component configured to be disposed in the internal space and to be electrically connected to the PCB;
a radiating sheet configured to be partly or entirely in contact with the electronic component and the PCB; and
a flexible printed circuit board (FPCB) antenna module configured to comprise an antenna pattern to electromagnetically operate in connection with an external device and to be electrically connected to the PCB and a nonconductive layer configured to surround the antenna pattern, and to be disposed on the radiating sheet,
wherein the nonconductive layer extends on the radiating sheet to the PCB or the electronic component.

17. The electronic device of claim 16, further comprising:
a bonding member configured to be disposed between the radiating sheet and the electronic component.

18. The electronic device of claim 16, further comprising:
an additional conductive pattern configured to extend from the antenna pattern to a region in which the electronic component is positioned.

19. The electronic device of claim 18, wherein the additional conductive pattern is formed along a boundary of a portion of the FPCB antenna module that extends to the electronic component.

20. The electronic device of claim 18, wherein the additional conductive pattern is spaced apart from a boundary of the radiating sheet when the FPCB antenna module is viewed from above.

* * * * *

UNITED STATES PATENT AND TRADEMARK OFFICE
CERTIFICATE OF CORRECTION

| | |
|---|---|
| PATENT NO. | : 11,431,083 B2 |
| APPLICATION NO. | : 16/833170 |
| DATED | : August 30, 2022 |
| INVENTOR(S) | : Kim et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 255 days.

Signed and Sealed this
Eleventh Day of February, 2025

Coke Morgan Stewart
*Acting Director of the United States Patent and Trademark Office*